(12) United States Patent
Reznicek et al.

(10) Patent No.: US 11,145,668 B2
(45) Date of Patent: Oct. 12, 2021

(54) EEPROM CELL AND ARRAY HAVING STACKED NANOSHEET FIELD EFFECT TRANSISTORS WITH A COMMON FLOATING GATE

(71) Applicant: International Business Machines Corporation, Armonk, NY (US)

(72) Inventors: Alexander Reznicek, Troy, NY (US); Karthik Balakrishnan, Scarsdale, NY (US); Jeng-Bang Yau, Yorktown Heights, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 16/375,298

(22) Filed: Apr. 4, 2019

(65) Prior Publication Data
US 2020/0006366 A1 Jan. 2, 2020

Related U.S. Application Data

(63) Continuation of application No. 16/020,502, filed on Jun. 27, 2018, now Pat. No. 10,283,516.

(51) Int. Cl.
*H01L 27/11556* (2017.01)
*H01L 29/788* (2006.01)
(Continued)

(52) U.S. Cl.
CPC ...... *H01L 27/11556* (2013.01); *G11C 16/045* (2013.01); *G11C 16/0441* (2013.01);
(Continued)

(58) Field of Classification Search
CPC .............. G11C 16/0441; G11C 16/045; G11C 16/0458; H01L 27/092; H01L 27/11551;
(Continued)

(56) References Cited

U.S. PATENT DOCUMENTS 4,672,580 A 6/1987 Yau
5,103,275 A 4/1992 Miura
(Continued)

OTHER PUBLICATIONS

IBM et al., "Stacked Dense CMOS RAM Using Silicon on Insulator Technology", An IP.com Prior Art Database Technical Disclosure, IP.com No. IPCOMM000044208D, Original Publication Date: Nov. 1, 1984, 3 pages.
(Continued)

*Primary Examiner* — Ermias T Woldegeorgis
(74) *Attorney, Agent, or Firm* — Daniel M. Yeates

(57) ABSTRACT

Semiconductor device, memory arrays, and methods of forming a memory cell include or utilize one or more memory cells. The memory cell(s) include a first nanosheet transistor connected to a first terminal, a second nanosheet transistor located on top of the first nanosheet transistor and connected in parallel to the first nanosheet transistor and connected to a second terminal, where the first and second nanosheet transistors share a common floating gate and a common output terminal, and an access transistor connected in series to the common output terminal and a low voltage terminal, the access transistor configured to trigger hot-carrier injection to the common floating gate to change a voltage of the common floating gate.

20 Claims, 11 Drawing Sheets

(51) Int. Cl.
  *G11C 16/04*      (2006.01)
  *H01L 27/11521*   (2017.01)
  *H01L 27/092*     (2006.01)
  *H01L 27/11524*   (2017.01)

(52) U.S. Cl.
  CPC ........ *G11C 16/0458* (2013.01); *H01L 27/092* (2013.01); *H01L 27/11521* (2013.01); *H01L 27/11524* (2013.01); *H01L 29/7885* (2013.01)

(58) Field of Classification Search
  CPC ........... H01L 29/7885; H01L 29/42392; H01L 29/42324
  See application file for complete search history.

(56) References Cited

U.S. PATENT DOCUMENTS

| | | | |
|---|---|---|---|
| 5,306,935 | A | 4/1994 | Esquivel |
| 5,604,367 | A | 2/1997 | Yang |
| 5,960,265 | A | 9/1999 | Acovic |
| 6,094,370 | A | 7/2000 | Takashima |
| 6,515,329 | B2 | 2/2003 | Lee |
| 6,724,036 | B1 | 4/2004 | Hsieh |
| 6,882,010 | B2 | 4/2005 | Bhattacharyya |
| 6,933,555 | B2 | 8/2005 | Hsieh |
| 7,700,993 | B2 | 4/2010 | Cai |
| 8,036,020 | B2 | 10/2011 | La Rosa |
| 8,198,153 | B2 | 6/2012 | Zhu |
| 8,705,280 | B2 | 4/2014 | Cai |
| 9,634,017 | B1 | 4/2017 | Baars |
| 9,659,655 | B1 | 5/2017 | Chan |
| 9,660,105 | B2 | 5/2017 | Divakaruni |
| 9,755,017 | B1 | 9/2017 | Guillorn |
| 9,780,106 | B2 | 10/2017 | Lee |
| 9,881,926 | B1 | 1/2018 | Basker |
| 9,947,677 | B1 | 4/2018 | Chan |
| 10,049,742 | B1 | 8/2018 | Ning et al. |
| 2007/0166921 | A1* | 7/2007 | Hong ............... H01L 29/7881 438/261 |
| 2009/0189215 | A1 | 7/2009 | Samanta |
| 2010/0149873 | A1* | 6/2010 | Wang ................ G11C 16/0441 365/185.05 |
| 2011/0193586 | A1 | 8/2011 | Kuo |
| 2011/0292733 | A1* | 12/2011 | Cai ..................... H01L 29/7881 365/185.18 |
| 2012/0175696 | A1 | 7/2012 | Franzon |
| 2017/0278553 | A1 | 9/2017 | Kojima |

OTHER PUBLICATIONS

List of IBM Patents or Patent Applications Treated as Related, Apr. 3, 2019, 2 pages.

Min et al., "A Novel Offset Gated Polysilicon Thin Film Transistor Without an Additional Offset Mask", IEEE Electron Device Letters, vol. 16, No. 5, May 1995. 3 pages.

Pfiester et al., "A Novel PMOS SOI Polysilicon Transistor", IEEE Electron Device Letters, vol. 11, No. 8, Aug. 1990. 3 pages.

Reznicek et al., "Stacked Nanosheet Field Effect Transistor Floating-Gate Eeprom Cell and Array," U.S. Appl. No. 16/020,502, filed Jun. 27, 2018.

Robertson, John, "Band offsets of wide-band-gap oxides and implications for future electronic devices", J. Vac. Sci. Technol. B 18(3), May/Jun. 2000, © 2000 American Vacuum Society, pp. 1785-1791.

Unknown, "Advanced Laser Processing enables next generation OLED and LCD Manufacturing", a technology update from Coherent, 2016. 12 pages.

Unknown, "Coherent Applications", Coherent, https://www.coherent.com/applications/index.cfm?fuseaction=Forms.page&PageID=172, last accessed Sep. 8, 2017. 2 pages.

* cited by examiner

EEPROM CELL AND ARRAY HAVING STACKED NANOSHEET FIELD EFFECT TRANSISTORS WITH A COMMON FLOATING GATE

BACKGROUND

The present disclosure relates generally to programmable complementary metal oxide semiconductor (CMOS) devices, and more specifically, to programmable CMOS devices comprising an n-type field effect transistor (nFET) and a p-type field effect transistor (pFET) with a commonly connected floating gate for storing electrical charges and methods of operating the same.

Hot carrier injection is a phenomenon in semiconductor devices where a charge carrier (e.g., an electron or a hole) overcomes a potential barrier and, potentially, changes the behavior of a semiconductor device (e.g., a CMOS device). This phenomenon provides one mechanism for the design of an electrically erasable programmable read-only memory (EEPROM), where the behavior of the device is stable over time but can be changed by the application of hot carrier injection.

SUMMARY

Disclosed herein are embodiments of a semiconductor device. The semiconductor device includes a first nanosheet transistor connected to a first terminal, a second nanosheet transistor located on top of the first nanosheet transistor and connected in parallel to the first nanosheet transistor and connected to a second terminal, where the first and second nanosheet transistors share a common floating gate and a common output terminal, and an access transistor connected in series to the common output terminal and a low voltage terminal, the access transistor configured to trigger hot-carrier injection to the common floating gate to change a voltage of the common floating gate.

Also disclosed herein are embodiments of a memory array. The memory array includes an N by M array of memory cells, wherein N represents the number of rows and M represents the number of columns. Each memory cell of the array includes a first nanosheet transistor connected to a first terminal and a second nanosheet transistor located on top of the first nanosheet transistor and connected in parallel to the first nanosheet transistor and connected to a second terminal, where the first and second nanosheet transistors share a common floating gate and a common output terminal. The memory array also includes N access transistors, with one of the N access transistors located in each row of the array, wherein each access transistor is connected in series to a low voltage terminal and the common output terminals of M memory cells in a row, and wherein the access transistors are configured to trigger hot-carrier injection to the common floating gate to change a voltage of the common floating gate.

Also disclosed herein are embodiments of a method of forming a memory cell in a memory array formed from an N by M array of memory cells. The method includes connecting a first nanosheet transistor to a first terminal, connecting a second nanosheet transistor located on top of the first nanosheet transistor, connected in parallel to the first nanosheet transistor and connected to a second terminal, where the first and second nanosheet transistors share a common floating gate and a common output terminal, connecting an access transistor in series to the common output terminal and to a low voltage terminal, wherein the access transistor is configured to trigger hot-carrier injection to the common floating gate to change a voltage of the common floating gate.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIGS. 2A-2L depict the formation of and resultant EEPROM cells wherein a nanosheet nFET is stacked upon a nanosheet pFET, in accordance with some embodiments of the present disclosure.

Figure 1:
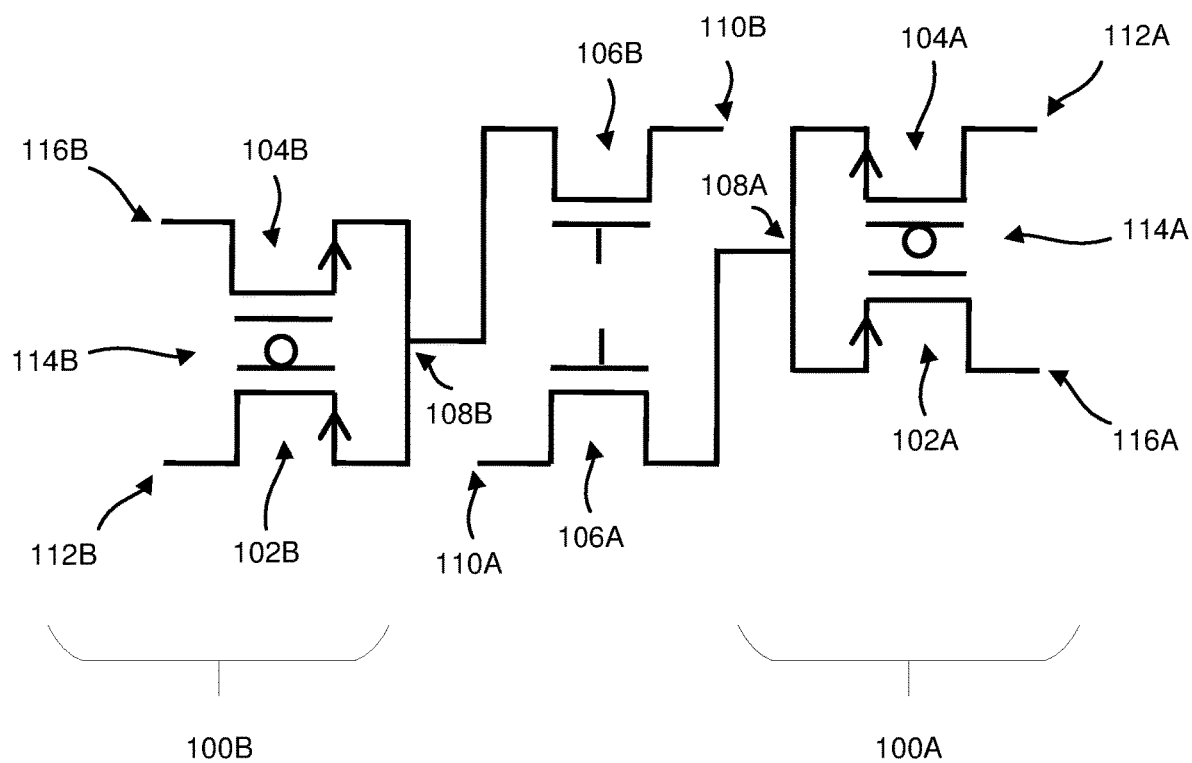
FIG. 1 depicts a circuit schematic for a pair of electrically erasable programmable read-only memory (EEPROM) cells and a pair of access transistors, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate generally to the field of programmable complementary metal oxide semiconductor (CMOS) devices, and more specifically, to programmable CMOS devices comprising a nanosheet n-type field effect transistor (nFET) and a nanosheet p-type field effect transistor (pFET) with a commonly connected floating gate for storing electrical charges. While the present disclosure is not necessarily limited to such applications, various aspects of the disclosure can be appreciated through a discussion of various examples using this context.

Existing designs for CMOS EEPROM devices suffer from inefficiencies in the application of hot hole injection. In particular, the use of silicon dioxide as a gate dielectric in CMOS devices results in a high energy barrier for the injection of hot holes (e.g., about 5 eV), such that the possible designs for CMOS EEPROM designs are limited.

Embodiments of the present disclosure implement common floating gate complementary metal oxide semiconductor (CMOS) electrically erasable programmable read-only memory (EEPROM) devices using gate dielectric materials that reduce the energy barrier for hot hole injection in an n-type field effect transistor (nFET) and the energy barrier for hot electron injection in a p-type field effect transistor (pFET). By lowering the energy barrier for hot hole injection in the nFET, some present embodiments make it possible to have the efficiency of hot hole injection in the nFET to be comparable to the efficiency of hot electron injection in the pFET. In one specific set of embodiments, a pair of nanosheet field effect transistors (FETs), one nFET and one pFET are arranged in a stacked formation wherein the nFET is located on top of the pFET. Such EEPROMs can be formed in an array to create addressable memory. The pair of nanosheet FETs are arranged electrically in parallel with a common floating gate. By using nanosheet FETs, the EEPROM cells can use higher drive currents than other technologies such as FinFETs, vertical transistors, or planar FETs, which can allow for much faster writing times. Also, by arranging the nanosheet FETs such that they are stacked, more such EEPROM cells may be placed in the same area than conventional designs. This can result in a higher density of EEPROM cells on a chip, such that larger amounts of memory can be located on a chip and/or smaller chips can be used. In the embodiments disclosed herein, one access transistor is present in each row of an EEPROM array, which can result in a higher density of EEPROM cells on a chip than designs utilizing an access transistor per cell, such that larger amounts of memory can be located on a chip and/or smaller chips can be used.

The aforementioned improvements and/or advantages of efficiency of hot hole injection, efficiency of hot electron injection, faster writing times, and space savings are example improvements and/or advantages. These improvements and/or advantages are a non-exhaustive list of example advantages. Embodiments of the present disclosure exist which can contain none, some, or all of the aforementioned advantages and/or improvements.

In one or more embodiments, a semiconductor structure is provided. The semiconductor structure includes a first transistor connected to a first terminal, a second transistor connected in parallel to the first transistor and a second terminal, where the first and second transistors share a common floating gate and a common node, and an access transistor connected in series to the common node and a low voltage terminal, the access transistor configured to trigger hot-carrier injection to the common floating gate to change a voltage of the common floating gate.

In one or more embodiments, a stacked and electrically parallel-connected nanosheet nFET and pFET with a common floating gate as a memory cell is provided that is capable of high efficiency programming/erasure utilizing avalanche hot-electron and hot-hole injections in the nanosheet pFET and the nFET, respectively, and high-density memory arrays consisting of such memory cell are also provided.

In one or more embodiments, parallel connection of the nanosheet nFET and pFET enables symmetric operation of the nanosheet nFET and pFET. One source/drain region of the nanosheet pFET is connected to a pFET terminal and one source/drain region of the nanosheet nFET is connected to an nFET terminal. The other source/drain region of the nanosheet pFET and the other source/drain region of the nanosheet nFET are connected together at a common node. An access transistor is connected in series to the common node and a low voltage terminal, which can be at ground. When the access transistor is turned on, the common node is pulled down to the low voltage, and a voltage applied to the pFET terminal induces hot-electron injection in the nanosheet pFET while a voltage applied to the nFET terminal induces hot-hole injection in the nanosheet nFET. In one or more embodiments, an electrically parallel-connected nanosheet nFET/pFET EEPROM device is provided with common floating-gate having efficient avalanche hot-electron injection in a pFET and efficient avalanche hot-hole injection in an nFET.

In one or more embodiments, hot-carrier injection efficiency can be improved significantly by reducing the energy barrier for injection. Efficient avalanche hot-electron injection in a nanosheet pFET is achieved, in some embodiments, by using silicon nitride ($Si_3N_4$), yttrium oxide ($Y_2O_3$), zirconium oxide ($ZrO_2$), or hafnium oxide ($HfO_2$) for a gate dielectric. These gate dielectric materials all have dielectric constant larger than silicon dioxide ($SiO_2$) and are usually referred to as high-k gate dielectrics. Efficient avalanche hot-hole injection in a nanosheet nFET is achieved, in some embodiments, by using silicon nitride ($Si_3N_4$), yttrium oxide ($Y_2O_3$), zirconium oxide ($ZrO_2$), or hafnium oxide ($HfO_2$) for a gate dielectric. The common-floating-gate parallel-nFET-pFET EEPROM device can be built on bulk Si, SOI, and/or using thin films of silicon on insulator. There can also be a thin interfacial SiO2 layer between device body (silicon) and high-k dielectric. The interfacial SiO2 should be sufficiently thin, e.g. less than 1 nm, to allow efficient tunneling of hot carriers through it.

In one or more embodiments, a memory array is provided. The memory array includes an x by y array of memory cells, each memory cell comprising a first nanosheet transistor connected to a first terminal, a second nanosheet transistor connected in parallel to the first transistor and a second terminal, where the first and second transistors share a common floating gate and a common node, wherein a nanosheet access transistor is connected in series to a low voltage terminal and the common node of y memory cells in a row, the access transistor configured to trigger hot carrier injection to the common floating gate to change a voltage of the common floating gate.

In one or more embodiments, a method for storing information on a memory cell in a memory array formed from an x by y array of memory cells is provided. The method includes connecting a first nanosheet transistor to a first terminal, connecting a second nanosheet transistor in parallel to the first transistor and a second terminal, where the first and second transistors share a common floating gate and a common output node, and connecting a nanosheet access transistor in series to the common node and a low voltage terminal, the access transistor configured to trigger hot-carrier injection to the common floating gate to change a voltage of the common floating gate.

In one or more embodiments, EEPROM cells and memory arrays are provided employing common-floating-gate parallel-nFET-pFET devices having efficient avalanche hot-electron injection in a nanosheet pFET and efficient avalanche hot-hole injection in a nanosheet nFET, with one access transistor per wordline. The array can be built on bulk Si, SOI, and/or thin films of polycrystalline Si on insulator. The CMOS peripheral circuits can be built on bulk and/or SOI silicon, independent of the array.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "drain" means a doped region in the semiconductor device located at the end of the channel, in which carriers are flowing out of the transistor through the drain.

As used herein, the term "source" is a doped region in the semiconductor device located at the end of the channel, in which majority carriers are flowing into the channel.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It is to be understood that aspects of the present disclosure will be described in terms of a given illustrative architecture; however, other architectures, structures, substrate materials and process features, and steps/blocks may be varied within the scope of aspects of the present disclosure. It should be noted that certain features cannot be shown in all figures for the sake of clarity. This is not intended to be interpreted as a limitation of any particular embodiment, or illustration, or scope of the claims.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Referring now to FIG. 1, a circuit schematic is shown for a pair of electrically erasable programmable read-only memory (EEPROM) cells 100A and 100B and a pair of access transistors 106A and 106B, in accordance with some embodiments of the present disclosure. The EEPROM cell 100A is formed from a first transistor 102A and a second transistor 104A with a shared gate terminal 114A. The transistors 102A and 104A are arranged in parallel with a source/drain region of the first transistor 102A and a source/drain region of the second transistor 104A connected together at a common node 108A. The other source/drain region of the first transistor 102A is connected to a voltage terminal 116A, and the other source/drain region of the second transistor 104A is connected to a voltage terminal 112A. An access transistor 106A is connected to a low voltage terminal 110A and the common node 108A in series. When the access transistor is turned on, the common node 108A is pulled down to approximately the same voltage as the low voltage terminal 110A.

In one example embodiment, the low voltage terminal 110A is at ground. In some embodiments, the first transistor 102A is an n-type field effect transistor (nFET) and the second transistor 104A is a p-type field effect transistor (pFET). In one embodiment, the access transistor 106A can be an nFET, though it should be understood that the particular configuration of the access transistor 106A can be adapted by those having ordinary skill in the art to the particular application. The first and second transistors 102A and 104A have a common output terminal 108A.

The access transistor 106A controls writing to and reading from the EEPROM cell 100A. The state of the device is held by the state of the common floating gate 114A. When the access transistor 106A is turned on, it pulls the common terminal 108A to approximately the same voltage as the low voltage terminal 110A. When the common terminal 108A is pulled down to the same voltage as the low voltage terminal 110A, hot carrier injection to the gate can occur in the first transistor 102A if a sufficiently high voltage is applied to terminal 116A, and hot carrier injection to the gate can occur in the second transistor 104A if a sufficiently high voltage is applied to terminal 112A. These charges due to hot carrier injection will remain on the floating gates until neutralized by charges of the opposite polarity (e.g., negatively charged electrons will remain until they meet positively charged holes and holes will remain until they meet electrons). Operations of reading from and writing to an EEPROM cell, such as EEPROM cell 100A, are discussed in further detail below in regard to methods 400, 500, and 600 of FIGS. 4-6, respectively.

In a CMOS device, electrons are free to move about in the semiconductor conduction band and holes are free to move about in the semiconductor valence band. The conduction band of the gate dielectric is at a higher electron energy level than the semiconductor conduction band. This energy difference represents a barrier energy for an electron getting from the semiconductor into the gate dielectric. For an electron to jump from the semiconductor into the gate dielectric, it has to acquire a kinetic energy equal to or greater than this barrier energy.

An electron having a kinetic energy larger than its thermal energy, which is determined by the semiconductor temperature, is referred to as a "hot" electron. Similarly, the valence band of the gate dielectric is at a higher hole energy level than the semiconductor valence band. This energy difference represents a barrier energy for a hole getting from the semiconductor into the gate dielectric. For a hole to jump from the semiconductor into the gate dielectric, it typically acquires a kinetic energy equal to or greater than this hole barrier energy. A hole having a kinetic energy larger than its thermal energy is referred to as a "hot" hole.

For an FET that uses silicon dioxide for a gate dielectric layer, hot electrons typically need a kinetic energy of about 3.1 eV, which is an energy barrier for electrons to be injected efficiently from the FET semiconductor into the FET gate dielectric. Hot electrons having smaller kinetic energy of, e.g., about 2.8 eV, may still be injected from the FET semiconductor into the FET gate dielectric by a tunneling process which is very inefficient. For a hot hole in such an FET, a higher kinetic energy of about 4.8 eV, which is the energy barrier for holes, is needed for it to be injected efficiently from the FET semiconductor into the FET gate dielectric. Hot holes having smaller kinetic energy of, e.g., about 3.1 eV, can only tunnel from the FET semiconductor into the FET gate dielectric, but at a negligibly slow rate.

The charge on the shared floating gate 114A determines which of the two transistors is active. The accumulated charges on the shared floating gate 114A will determine the voltage on the gate of the devices relative to their source terminals and will turn those devices off or on, such that appreciable current will flow between terminal 116A and the common terminal 108A or between terminal 112A and common terminal 108A when the access transistor 106A is activated.

In addition, FIG. 1 depicts an EEPROM cell 100B, which is formed from a first transistor 102B and a second transistor 104B with a shared gate terminal 114B. The transistors 102B and 104B are arranged in parallel with a source/drain region of the first transistor 102B and a source/drain region of the second transistor 104B connected together at a common node 108B. The other source/drain region of the first transistor 102B is connected to a voltage terminal 116B, and the other source/drain region of the second transistor 104B is connected to a voltage terminal 112B. An access transistor 106B is connected to a low voltage terminal 110B and the common node 108B in series. When the access transistor is turned on, the common node 108B is pulled down to approximately the same voltage as the low voltage terminal 110B.

Similarly to the above described example, the components of EEPROM cell 100B can have the same roles as those of EEPROM cell 100A. For example, in some embodiments, the first transistor 102B is an n-type field effect transistor (nFET) and the second transistor 104B is a p-type field effect transistor (pFET). The access transistor 106B can control writing to and reading from the EEPROM cell 100B using hot carrier injection as described above with regard to EEPROM cell 100A.

This circuit schematic depiction of multiple EEPROM cells (100A and 100B), each with two transistors shown vertically, and of two access transistors depicted vertically with one over the other can match the locations of the components of these EEPROM cells and access transistors when fabricated, as depicted and discussed in more detail below. Creation of these EEPROM cells and access transistors can be done using nanosheets, with for example, multiple nFETs (some of which are part of EEPROM cells and some of which are access transistors) being created next to each other, with multiple pFETs being created on top of the nFETs. In some embodiments, the reverse placement may be used with pFETs on bottom and nFETs on top. Stacked access transistors can be created with both nFETs on bottom and top, or in some embodiments pFET access transistors can be used. In other embodiments, pFETs located on top of access transistors can be left unconnected and access transistors may all be located in the same plane as the nFETs of the EEPROM cells. A person skilled in the art may envision and create alternative layouts and arrangements using the teachings presented herein.

Referring now to FIGS. 2A-2L, illustrated are diagrams formation of and resultant EEPROM cells 200A and 200B wherein a nanosheet nFET is stacked upon a nanosheet pFET, in accordance with some embodiments of the present disclosure. In some embodiments, EEPROM cells 200A and 200B are consistent with FIG. 1's EEPROM cells 100A and 100B. FIGS. 2A-2L illustrate side views of the formation of and resultant EEPROM cells 200A and 200B from the end of the forming or resultant EEPROM cells 200A and 200B with the materials continuing through the page into a third dimension.

Figures 2A, 2B:
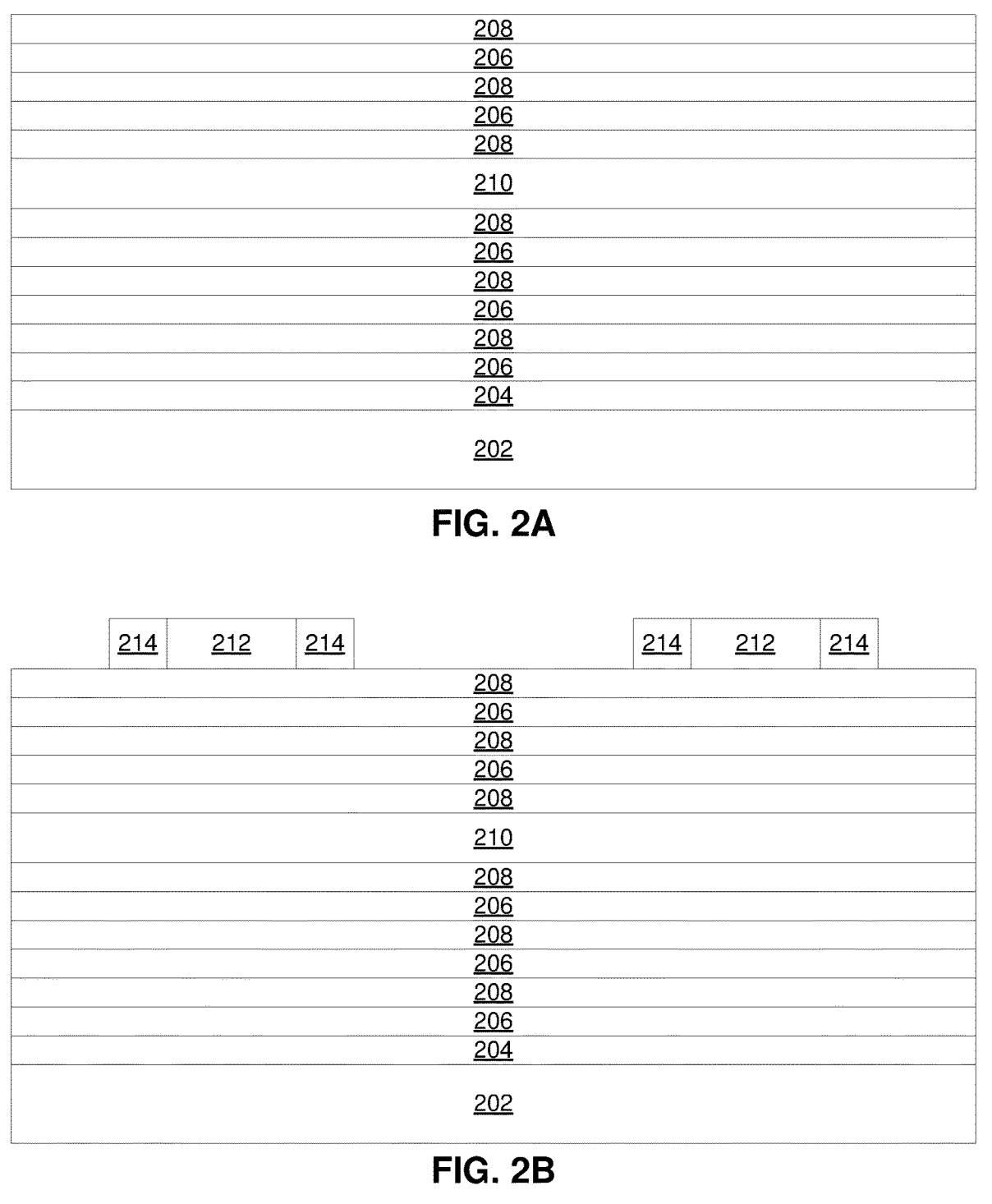
Figures 2C, 2D:
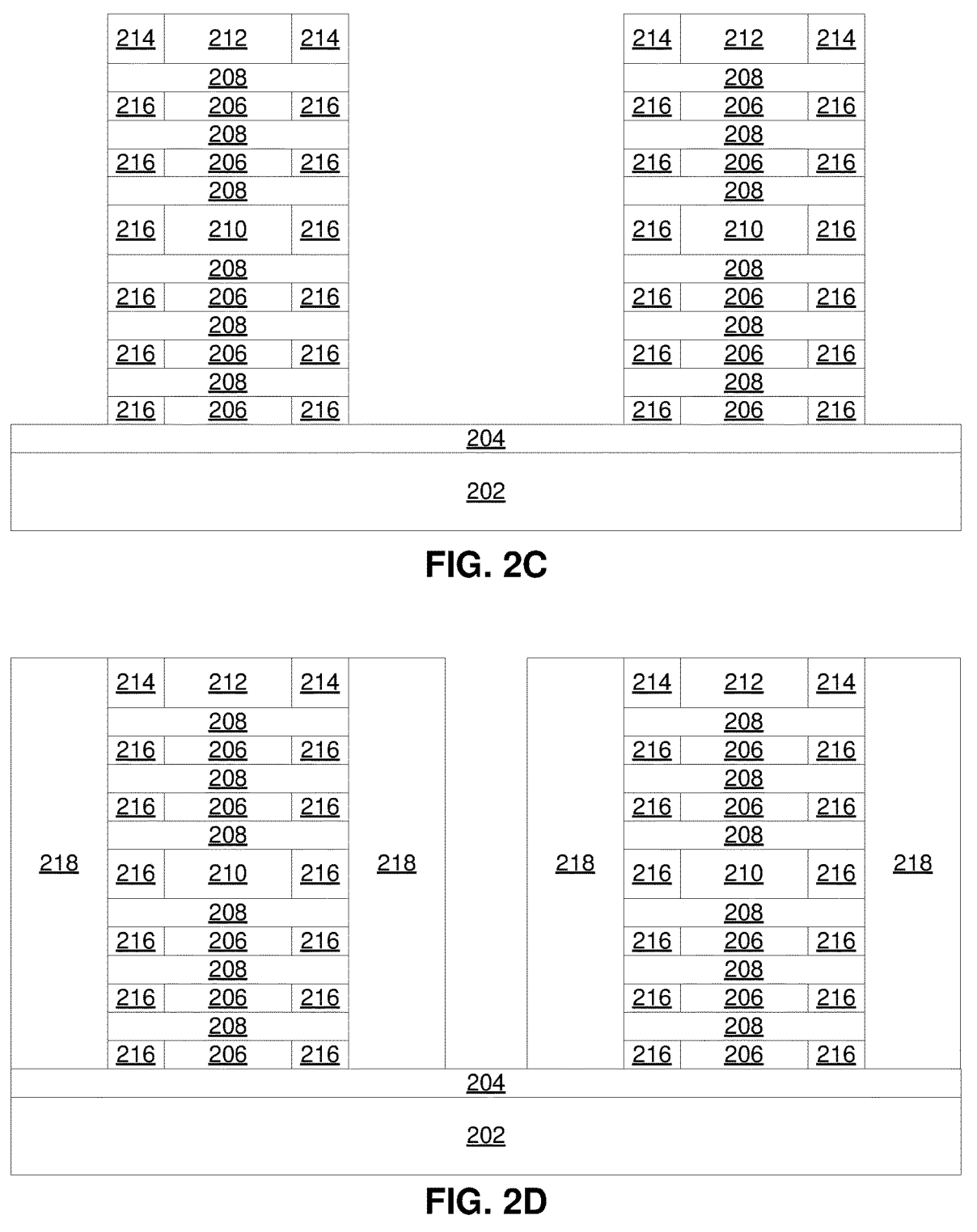
Figure 2E:
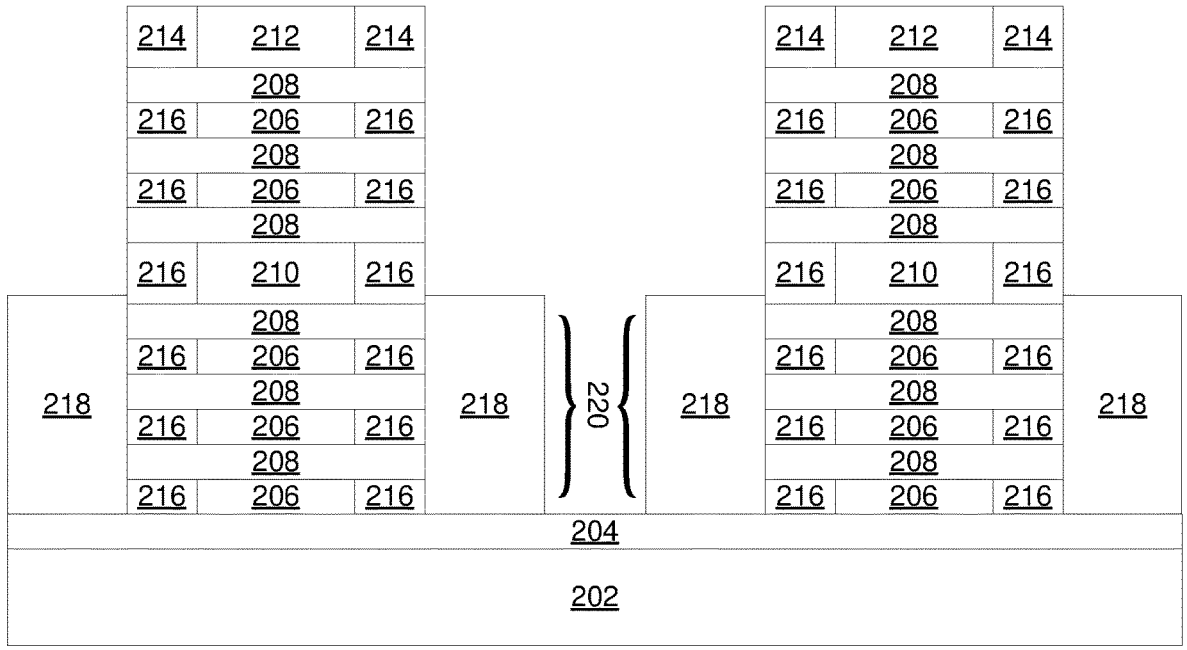

Beginning with FIG. 2A, shown is a substrate 202. In some embodiments, the substrate 202 can be a silicon on insulator (SOI) substrate. In some embodiments, instead of a SOI substrate, the EEPROM cells 200A and 200B can be built using bulk silicon and/or using thin films of silicon on insulator. Due to the floating body effect, avalanche hot-carrier injection is typically more efficient when using a SOI substrate as shown or using thin-film polycrystalline silicon on insulator than bulk silicon. On top of the substrate 202 is a dielectric isolation layer 204. The insulator layer 204 can be a buried oxide (BOX) layer in some embodiments. The choice of materials for the insulator layer 204 can vary in embodiments, including for example, silicon dioxide or sapphire. On top of the dielectric isolation layer 204 are alternating layers of silicon germanium (SiGe) (layers 206 and 210) and layers of silicon (Si) (layers 208). Layer 210 is depicted as thicker than the other SiGe layers 206 to accommodate the arrangement shown in FIGS. 2E through 2L, but in other embodiments, all SiGe layers may be of the same thickness or may be of varying thicknesses. Shown in FIGS. 2A through 2L are three lower Si layers 208 (below layer 210), which correspond to nanosheet pFETs, and three upper Si layers 208 (above layer 210), which correspond to nanosheet nFETs. Alternate embodiments can exist with two Si layers per nFET, more than 3 layers, or different numbers of layers for the pFETs than the nFETs. The layers 204, 206, 208, and 210 can be formed on the substrate 202 by deposition processes known to those skilled in the art.

In some embodiments, layers 206, 208, and 210 can be other silicon-containing semiconductor materials such as, e.g., silicon germanium carbide, silicon carbide, polysilicon, epitaxial silicon, and amorphous silicon. Although silicon is the predominately used semiconductor material in wafer fabrication, alternative semiconductor materials can be employed instead, such as, but not limited to, germanium, gallium arsenide, gallium nitride, cadmium telluride, and zinc selenide.

FIG. 2B shows the substrate 202 and layers 204, 206, 208, and 210 where dummy gates 212 and dummy gate spacers 214 have been patterned on top of the uppermost silicon layer 208. Dummy gates 212 can be made from any materials which can be patterned and serve as hard masks for subsequent etching processes. In some embodiments, dummy gates 212 can be made from be polycrystalline silicon or could be silicon dioxide ($SiO_2$). Dummy gate spacers 214 can be made from materials such as silicon nitride or silicon dioxide. Creation of dummy gates 212 and dummy gate spacers 214 can proceed by deposition of layers in a planar fashion followed by patterning using techniques known to those skilled in the art.

FIG. 2C shows the formation of EEPROM cells 200A and 200B where the layers 206, 208, and 210 have been etched away down to the dielectric isolation layer where not covered by dummy gates 212 and dummy gate spacers 214. This will allow for formation of the source and drain regions of the nanosheet transistors on either side. This etching process can be one such as dry reactive ion etching, or using any etching process which selectively etches the Si and SiGe layers 206, 208, and 210 without etching the dielectric isolation layer 204. In some embodiments, the etching process can be one where the etching will etch SiGe more so than Si, which will allow for formation of spacers 216 on the edges of the SiGe layers 206 and 210. In other embodiments, this can proceed in two steps where the first step etches the Si layers 208 and SiGe layers 206 and 210 to the same degree, followed by an additional etch which etches the SiGe layers 206 and 210 laterally. After the etching process, spacers 216 can be deposited using a technique such as chemical vapor deposition or atomic layer deposition (ALD) to sub nanometer precision control. These spacers 216 can be made from materials such as silicon nitride or silicon dioxide.

FIG. 2D shows the product of FIG. 2C with the addition of pillars 218. In some embodiments, the pillars 218 are comprised of boron-doped silicon germanium (SiGe:B). This can be achieved using epitaxial growth. These SiGe:B pillars 218 will serve as the source and drain regions of the nanosheet pFETs of EEPROM cells 200A and 200B. In other embodiments, different materials than SiGe:B can be used. These include p-type dopants (including but not limited to: aluminum, nitrogen, gallium, and/or indium) added to silicon containing materials. This can occur by epitaxial growth of a silicon containing material followed by ion implantation of the p-type dopants.

FIG. 2E shows the product of FIG. 2D where the SiGe:B pillars 218 have been etched down to a desired height. As discussed above, the nanosheet pFETs (as indicated by numeral 220) of EEPROM cells 200A and 200B will correspond with the three lower Si layers 208 (below layer 210), and as such, the SiGe:B pillars 218 serve as the source and drain regions have been etched such that these three Si layers 208 connect the SiGe:B sources and drains. This etching can be performed by a timed etch with the time required computed by using the desired thickness and the etch rate.

Figure 2F:
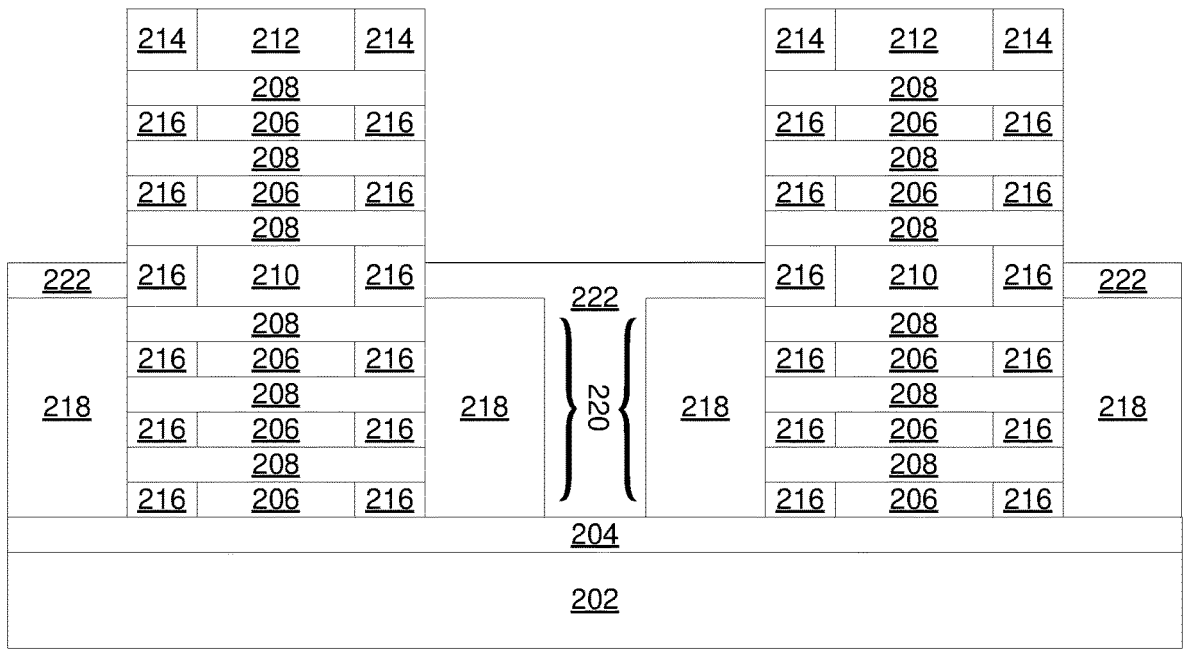

FIG. 2F shows the result of depositing an oxide onto the product of FIG. 2E. This oxide will serve as a field oxide (FOX) separating the nanosheet pFETs from the nanosheet nFETs. This can be performed in a single step with deposition controlled to reach the desired height or in a two-step process of deposition followed by controlled etching to the desired height.

Figure 2G:
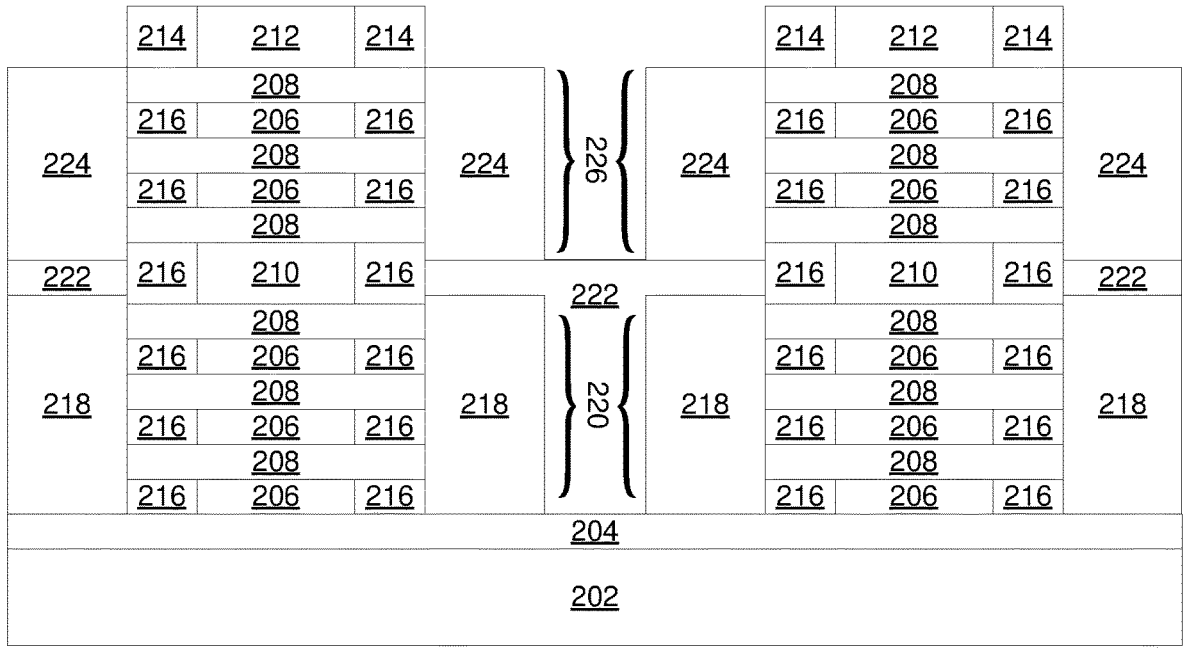

In FIG. 2G, depicted is the product of FIG. 2F wherein an additional epitaxial growth has performed. Pillars 224 are composed of phosphorus-doped silicon (Si:P) in some embodiments. These Si:P pillars 224 will serve as the source and drain regions of the nanosheet nFETs (as indicated by numeral 226) of EEPROM cells 200A and 200B. This can occur in a single step with epitaxial growth controlled to reach the desired height or in a two-step process of deposition followed by controlled etching to the desired height. In other embodiments, different materials than Si:P can be used. These include n-type dopants (including but not limited to: arsenic, antimony, bismuth, and/or lithium) added to silicon containing materials. This can occur by epitaxial growth of a silicon containing material followed by ion implantation of the n-type dopants.

Figure 2H:
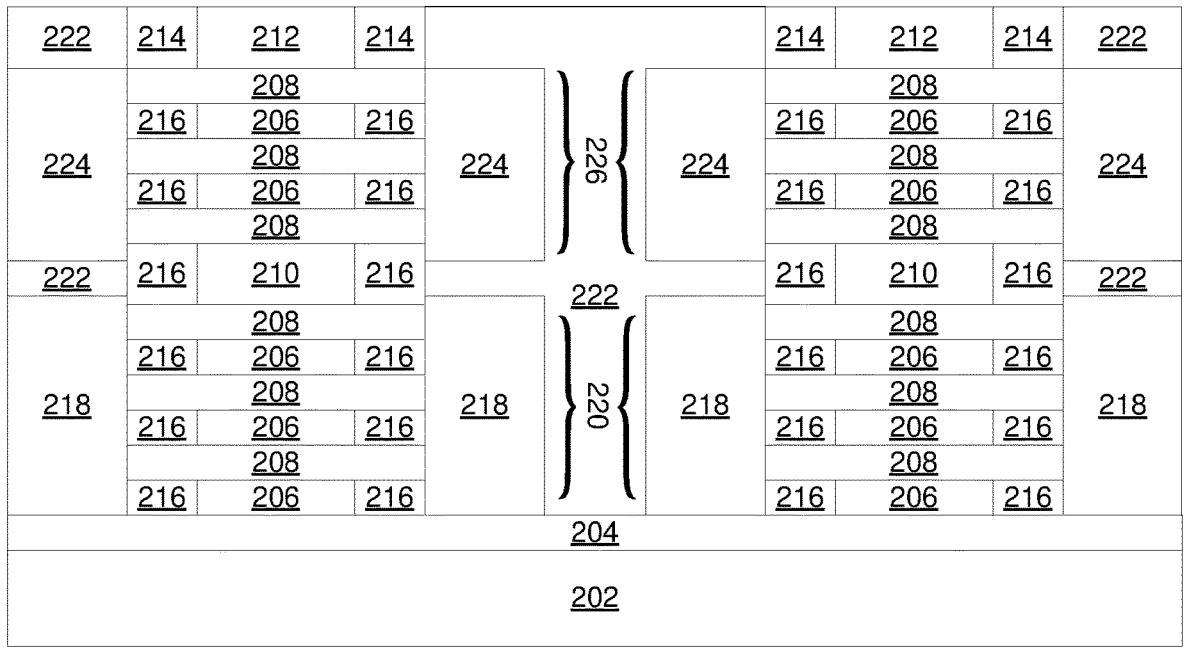

FIG. 2H shows the product from FIG. 2G where a dielectric material has been formed on top of the Si:P pillars 224. This can be the same oxide as the field oxide 222 as shown or can be another interlayer dielectric or other dielectric material. This can be followed by chemical mechanical polishing to planarize the product, making the dielectric material flush with the top of dummy gates 212 and dummy gate spacers 214.

Figure 2I:
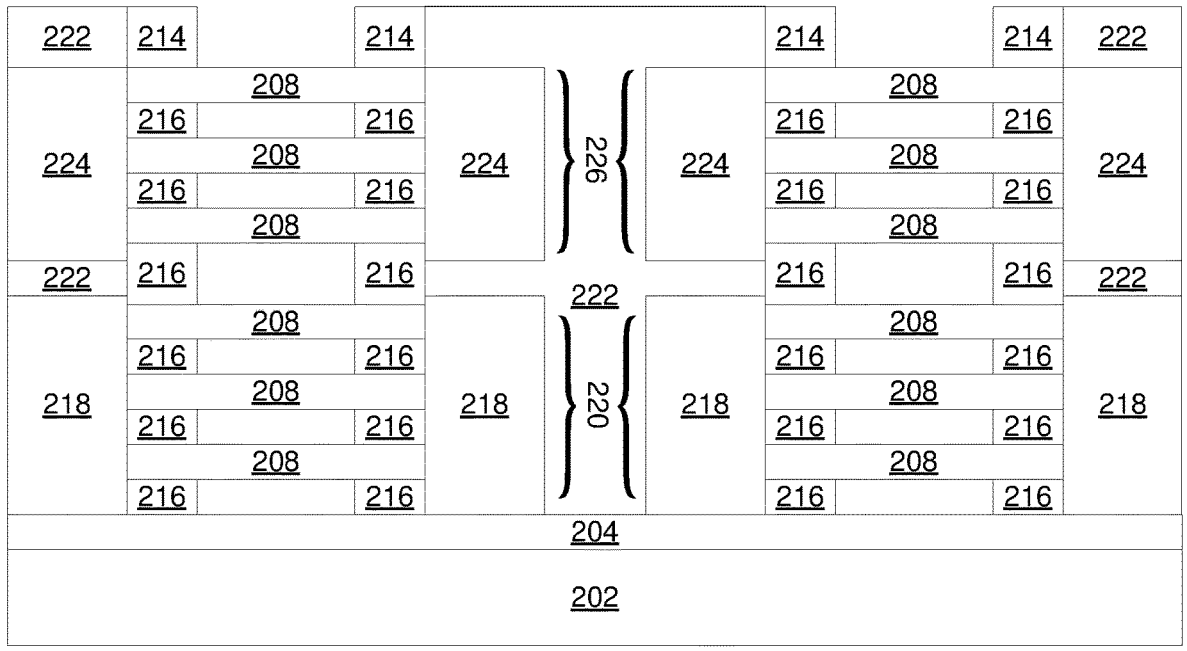

FIG. 2I shows the product from 2H following dummy gate removal and SiGe channel release). This process can vary in embodiments and may depend on the material chosen for the dummy gates. Removal of dummy gates 212 and SiGe layers 206 and 210 should be selective, such that only the dummy gates 212 and SiGe layers 206 and 210 are removed and not remaining materials. In some embodiments, removal of both dummy gates 212 and SiGe layers 206 and 210 are removed at the same time, and in other embodiments, removal may proceed in two or more steps. While the SiGe layers 206 and 210 are not at the top of the stacked materials, removal may proceed because the depiction of the formation of EEPROM cells 200A and 200B is shown as a side view, with the end of the product at the plane of the page and the forming EEPROM cells 200A and 200B continuing into the page. Removal of the SiGe layers 206 and 210 creates hollow channels.

Figure 2J:
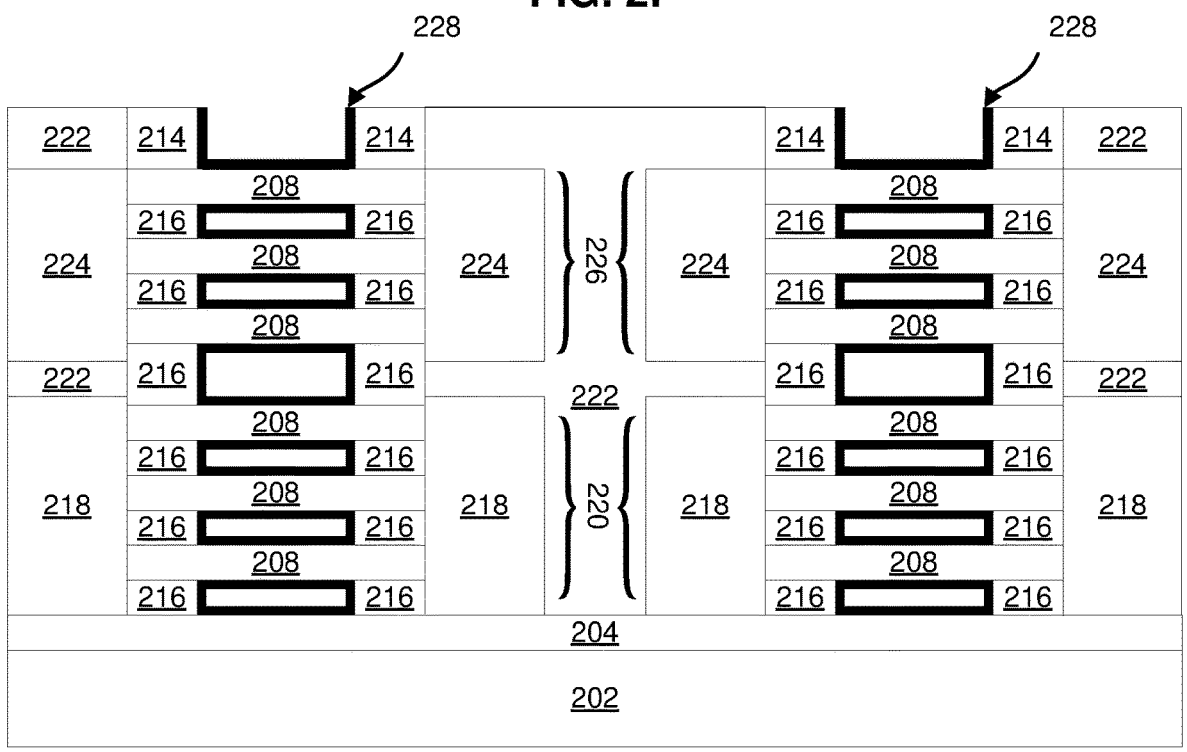

In FIG. 2J, the product of FIG. 2I is shown with gate dielectric 228 deposited into the hollow channels and recesses left by removal of dummy gates 212 and SiGe layers 206 and 210. This deposition can be performed using an evaporative process to deposit material on the exposed surfaces. While arrows to gate dielectric 228 appear only at the top of FIG. 2J (and later figures) for convenience, the matching thick black lines in the hollows left by layers 206 and 210 are also gate dielectric 228. The gate dielectric 228 can be chosen to achieve efficient hot hole injection in the nanosheet nFETs and efficient hot electron injection in the nanosheet pFETs and can be selected from materials such as, e.g., silicon nitride ($Si_3N_4$), yttrium oxide ($Y_2O_3$), zirconium oxide ($ZrO_2$), or hafnium oxide ($HfO_2$). These materials are referred to herein as low injection-barrier materials. Each of these materials provide energy barriers significantly lower than that imposed by silicon dioxide.

The use of low injection-barrier materials for the gate dielectric of nFET and pFET makes it possible to implement the EEPROM cells 200A and 200B as described. This structure allows efficient injection (e.g., fast injection at low voltage) of hot holes in the nFET into the common gate, thus turning on the nFET, and efficient injection of hot electrons in the pFET into the common gate, thus turning off the nFET. The detailed operation of the EEPROM cells 200A and 200B, including writing, erasing, and reading is described in greater detail below.

Figure 2K:
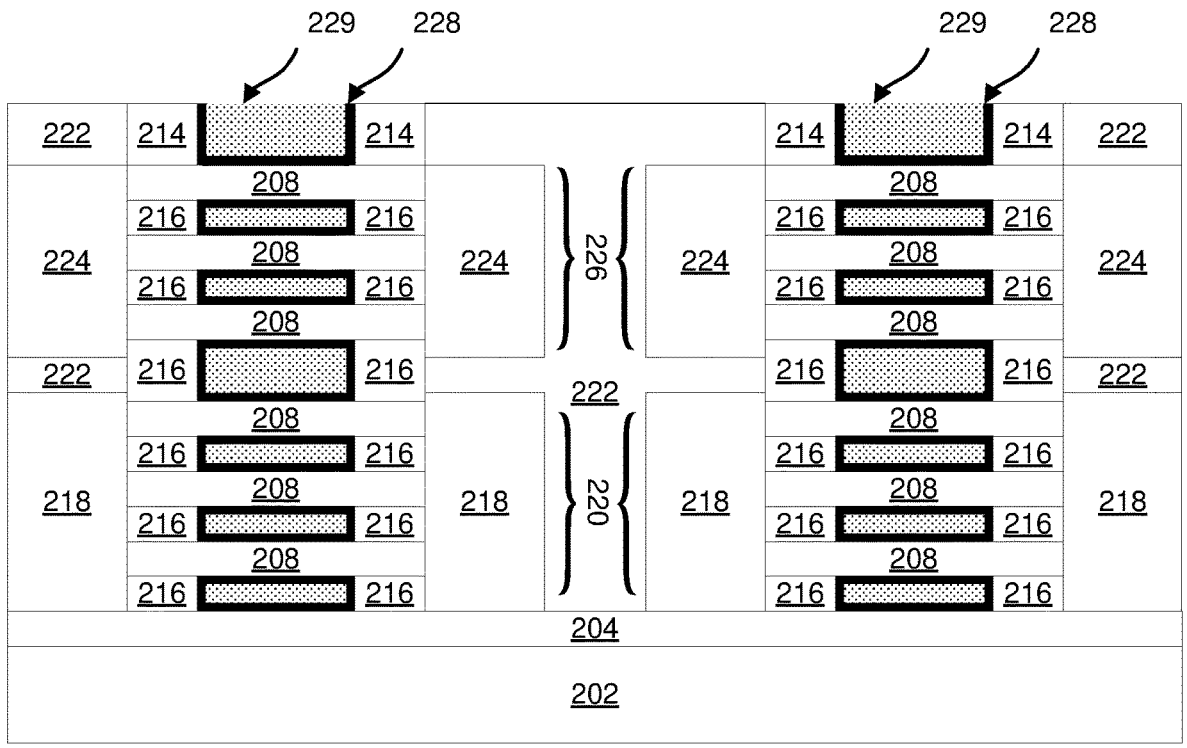

Referring now to FIG. 2K, shown are the partially formed EEPROM cells from FIG. 2J with gate metal 229 (depicted as the dotted regions) filled in the remaining hollow channels and recesses left by removal of dummy gates 212 and SiGe layers 206 and 210. The game metal 229 can also wrap around the silicon channels 208. Gate metal 229 forms the common floating gates of the EEPROM cells 200A and 200B. Addition of gate metal 229 can proceed by a similar evaporative process as used to deposit gate dielectric 228. At this stage, formation of EEPROM cells 200A and 200B.

Figure 2L:
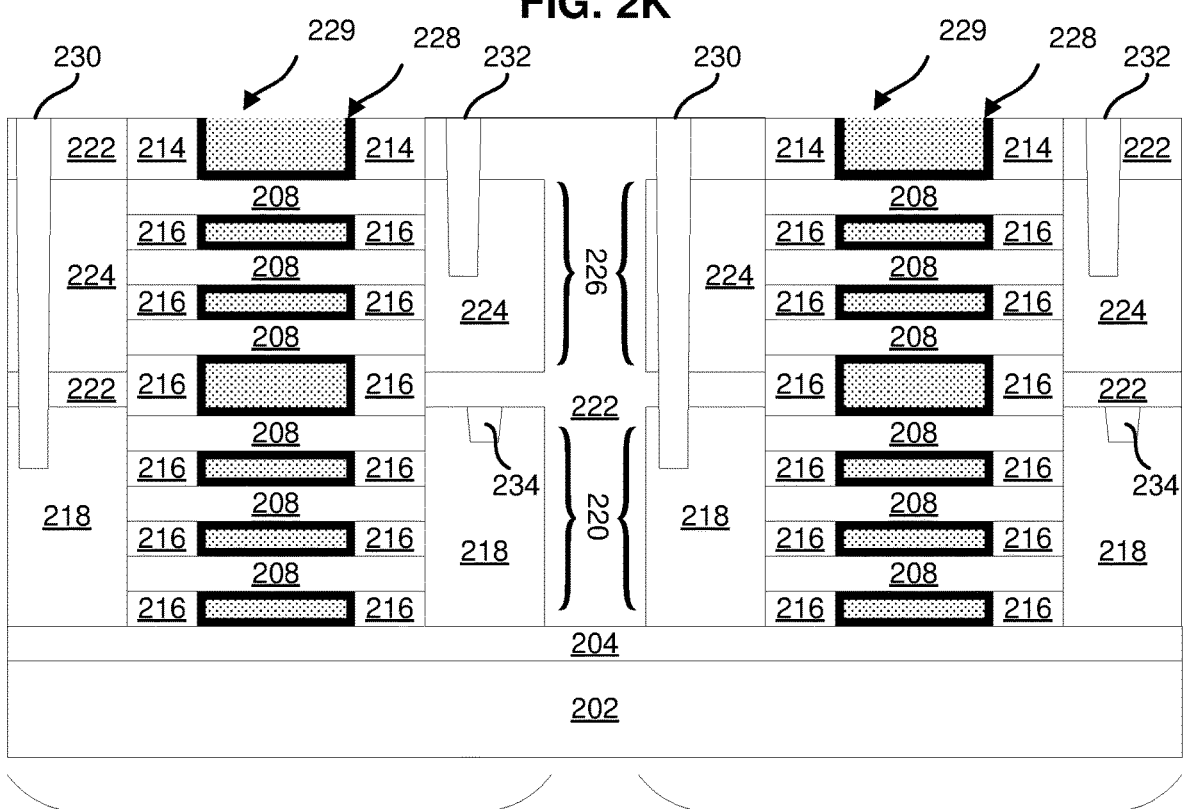

Shown in FIG. 2L are EEPROM cells 200A and 200B with the addition of contacts 230, 232, and 234 for accessing the EEPROM cells. Creation of contacts 230, 232, and 234 can proceed via a multi-step process, such as defining via holes by photolithography, etching into the respective SiGe:B pillars 218 and Si:P pillars 224 to form the vias, followed by backfilling the vias with suitable metals. These metals may be tungsten, copper, or any other suitable metal for contacting with a semiconductor known to those of skill in the art. These contacts can be connected to wordlines (not depicted in FIG. 2, but such as wordlines WL0, WL1, and WL2 of FIG. 3 described below) and bitlines (not depicted in FIG. 2, but such as bitlines B0R and B0L, B1R and B1L, or B2R and B2L of FIG. 3 described below) for incorporation of EEPROM cells 200A and 200B into a memory array, such as memory array 300 of FIG. 3.

Collectively, these metal contacts can allow for application of one or more voltages to the connected portions of EEPROM cells 200A and 200B and enable operation of EEPROM cells 200A and 200B in accordance with methods 400, 500, and 600 (discussed below with regard to FIGS. 4, 5, and 6, respectively). While EEPROM cells 200A and 200B are shown with the pFET located below the nFET, alternative designs with the nFET located below the pFET are contemplated by this disclosure and may be created using the teachings disclosed herein.

Figure 3:
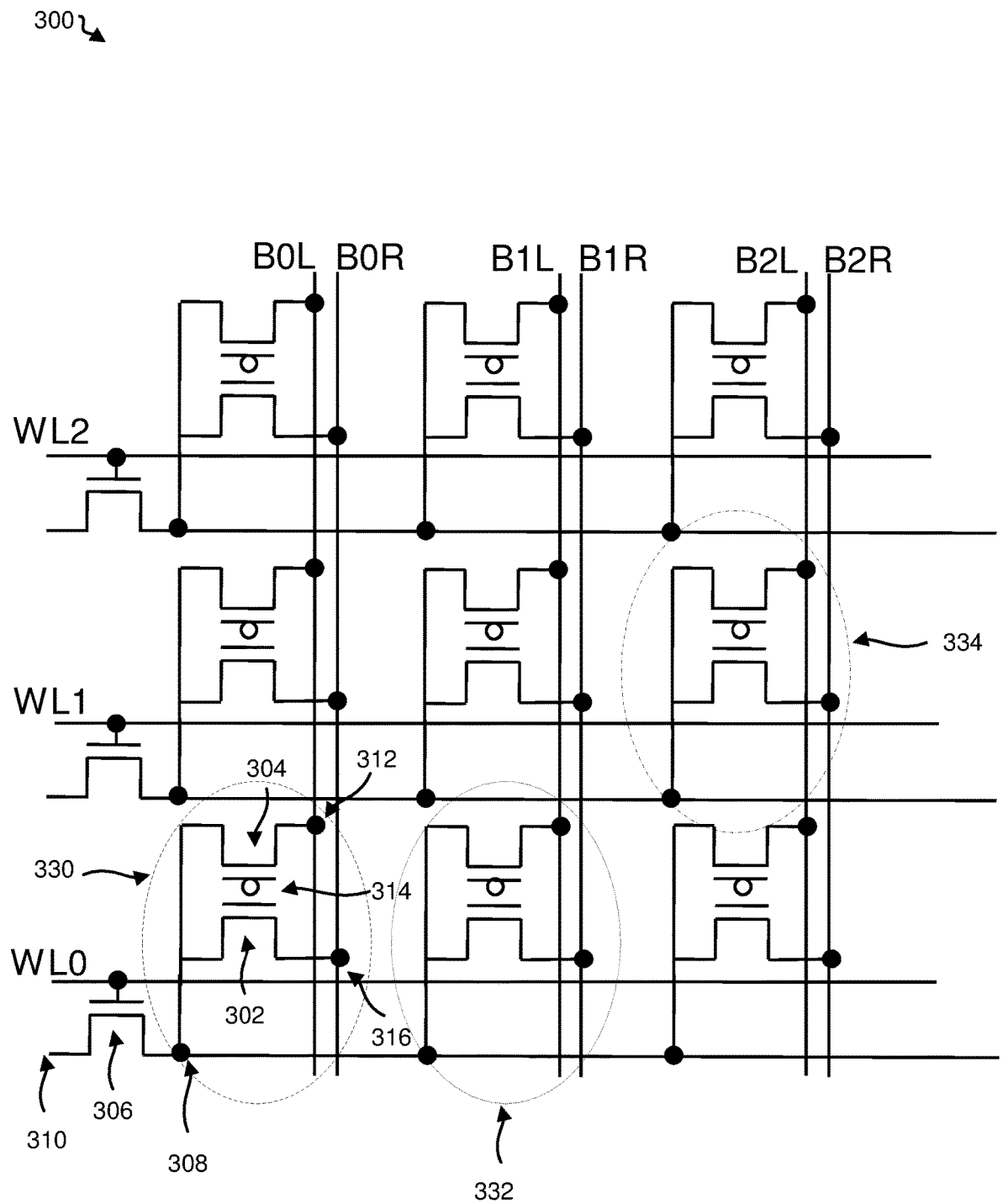
FIG. 3 depicts a circuit schematic of an array of EEPROM cells, in accordance with some embodiments of the present disclosure.

Referring now to FIG. 3, depicted is a circuit schematic of an array 300 of EEPROM cells, including cells 330, 332, and 334 (which in some embodiments can each be consistent with one of EEPROM cell 100A or 100B of FIG. 1 and/or EEPROM cell 200A or 200B of FIG. 2). One such EEPROM cell 330 is shown within the dashed ellipse. This array 300 has a 3×3 grid of EEPROM cells, which consists of three rows and three columns. In other embodiments, the array of EEPROM cells may have different numbers of rows, different numbers of columns, or both. Such an array may be described as an x by y array with x rows and y columns. The bottom row of the grid has an access transistor 306 connected in series to a low voltage at terminal 310 and to the common node 308 of each EEPROM cell 330 in the row. The gate of the access transistor 306 is connected to wordline WL0. EEPROM cell 330 contains a pFET 304 with a terminal 312 connected to a bitline B0L. EEPROM cell 330 contains an nFET 302 with a terminal 316 connected to a bitline B0R. The pFET 304 and nFET 302 of EEPROM cell 330 are connected in parallel and share a common floating gate 314.

While components have been labeled and described primarily for the lower left EEPROM cell 330, each row contains an access transistor and each EEPROM cell contains the same components arranged in the same configuration. For example, the EEPROM cell immediately to the right of the described cell and shown within the dotted ellipse is EEPROM cell 332. EEPROM cell 332 connects to wordline WL0 and bitlines B1L and B1R in a similar fashion to EEPROM cell 330. Similarly, EEPROM cell 334 is shown within the dashed and dotted ellipse, connects to wordline WL1 and bitlines B2L and B2R in a similar fashion to EEPROM cell 330. It should be understood that an array of any size can be used instead.

Continuing with the example EEPROM cell 330, the common floating gate 314 can be programmed by avalanche hot-hole injection in the nFET 302 (writing a logical "1" to the EEPROM cell 330) and hot-electron injection in the pFET 304 (writing a logical "0" to the EEPROM cell 330). Furthermore, the gate dielectric of the nFET 302 is chosen to enable fast injection of hot holes at low voltage, and the gate dielectric of the pFET 304 is chosen to enable fast injection of hot electrons at low voltage. As an example, for a pFET having $HfO_2$ as gate dielectric, hot-electron injection can be accomplished in less than 10 ns at a source-to-drain voltage of about 3V. For an EEPROM cell 330 operated with about 3V across its nFET 302 for avalanche hot-hole injection and about 3V across its pFET 304 for avalanche hot-electron injection, the applied voltages for array 300 during operation can be as follows.

When no action is being performed, during standby, the voltage on each of the wordlines and bitlines is 0V (WL0=B0L=B0R=0V). The voltage values for WL0, B0L, and B0R for selecting EEPROM cell 330 in array 300 for reading, writing a value "1," or writing a value "0" are as indicated in Table 1 below. The voltages could vary, for example, by about 10% in this specific embodiment without affecting proper operation of the array. In other embodiments, read voltages of approximately 1.5V for each bitline could be used. Tables of voltages for selecting the other EEPROM cells in array 300 can be derived by substituting the corresponding wordlines and bitlines of the cell being selected.

TABLE 1

|  | WL0 | B0L | B0R |
|---|---|---|---|
| Write "1" | 1.5 V | 0 V | 3.0 V |
| Write "0" | 1.5 V | 3.0 V | 0 V |
| Read | 1.5 V | 1.0 V | 1.0 V |

To write a value "1" to the EEPROM cell 330, the wordline WL0 is raised to about 1.5V to turn on the access transistor 306, pulling the common node 308 to about 0V (the voltage of terminal 310), the bitline B0L is dropped to about 0V so that there is little voltage across the pFET 304, and the bitline B0R is raised to about 3V, resulting in a voltage of about 3V across the nFET 302, causing hot-hole injection in the nFET 302.

To write a value "0" to the EEPROM cell 330, the wordline WL0 raised to about 1.5V to turn on the access transistor 306, pulling the common node 308 to about 0V (the voltage of terminal 310), the bitline B0R is dropped to about 0V so that there is little voltage across the nFET 302, and the bitline B0L is raised to about 3.0V to create a voltage of about 3.0V across the pFET 304, causing hot-electron injection in the pFET 304.

To read the value of the EEPROM cell 330, the wordline WL0 is raised to about 1.5V to turn on the access transistor 306, pulling the common node 308 to about 0V (the voltage of terminal 310), the voltage of B0L and B0R are dropped to about 1.0V, creating a voltage of about 1.0V across the nFET 302 and a voltage of about 1.0V across the pFET 304.

In general, the time needed for hot-carrier injection in nFET 302 and pFET 304 is a strong function of the voltage across the devices during injection. For example, for a pFET having silicon dioxide ($SiO_2$) as gate dielectric, the rate of hot electron injection can increase by about 10 times when the device voltage is changed from about 3V to about 3.5V. A 10% voltage variation is well within the design of typical integrated circuit chips.

For non-selected cells on the same wordline, for example when writing a "1" to another cell, the voltage across the nFETs in the non-selected cells will be about 0V and there will be negligible hot-hole injection in the nFETs in the non-selected cells. Similarly, when writing a "0" in another cell, the voltage across the pFETs in the non-selected cells will be about 0V, resulting in negligible hot-electron injection in the pFETs in the non-selected cells. For non-selected cells on the same output bitline the common nodes in the non-selected cells is "floating," being isolated from low voltage terminal (e.g. terminal 310 connected to the access transistor connected to EEPROM cell 330) because the access transistor is not turned on. This causes the voltage between the pair of bitlines for the cell (e.g. bitline B0L and bitline B0R or bitline B2L and bitline B2R) to be divided between the nFET and the pFET. The net result is that the voltage across either the nFET or the pFET is not large enough to cause hot carrier injection in either the nFET or the pFET.

The use of low injection-barrier materials in the EEPROM cells of array 300 provide superior efficiency, as significantly lower voltages can be used as compared to when conventional materials are used. For example, with a silicon dioxide ($SiO_2$) gate dielectric layer, there is negligible hot-electron injection at voltages less than about 2.5V whereas, with a low injection-barrier material such as $HfO_2$, appreciable hot-electron injection can be achieved at voltages starting at about 1.5V. For programming with electron injection densities of about $1·10^{12}/cm^2$, a semiconductor-on-insulator pFET with an $HfO_2$ gate dielectric can be programmed in less than 10 ns at a voltage of 2.5V.

The array 300 can be built on various materials, including bulk semiconductor, semiconductor-on-insulator, or thin films of polycrystalline silicon on insulator. The logic circuits that control the operation of a memory array can be fabricated on the same semiconductor substrate as the memory array to produce a memory chip, or they can be fabricated on a separate substrate and then packaged together with the memory array to form a memory package. These logic circuits are referred to herein as peripheral circuits. The peripheral circuits can be integrated with the memory array(s) on the same semiconductor substrate to improve speed and reliability. Alternatively, to reduce cost, which can be important for large EEPROM systems, the peripheral circuits can be built on bulk semiconductor or semiconductor-on-insulator substrates independent of the array.

Figure 4:
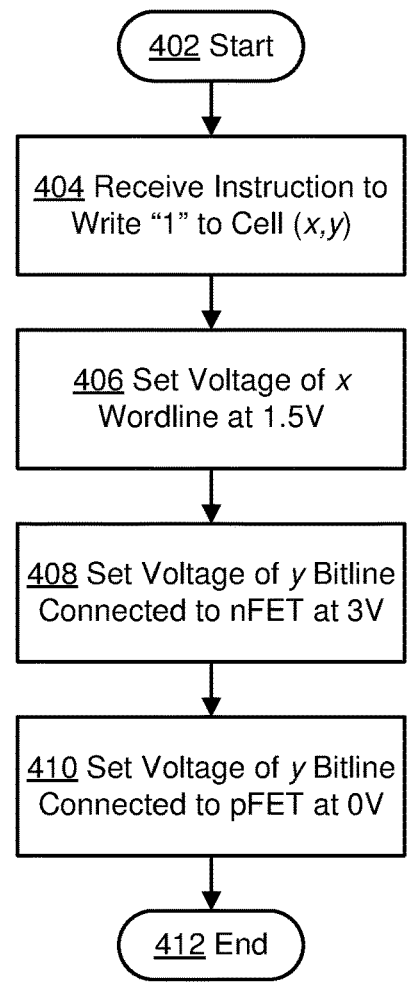
FIG. 4 depicts an example method for writing a logical "1" to an EEPROM cell, in accordance with embodiments of the present disclosure.

Referring now to FIG. 4, depicted is an example method 400 for writing a logical "1" to an EEPROM cell, in accordance with embodiments of the present disclosure. In embodiments, the EEPROM cell described in method 400 can correspond to one of EEPROM cells 100A or 100B of FIG. 1, EEPROM cells 200A or 200B of FIG. 2, EEPROM cells 330, 332, or 334 of FIG. 3, or other EEPROM cells disclosed herein and can be located within an array such as array 300 of FIG. 3. Method 400 is described herein as performed by a memory device. In various embodiments, method 400 can alternatively or additionally be performed by a memory controller, a computer system, or another component of a computer system. Method 400 can include more or less operations than those depicted. Method 400 can include operations in different orders than those depicted.

From start 402, method 400 proceeds to 404 and the memory device receives an instruction to write a logical "1" to a cell (x,y) of an array (with x representing the horizontal index and y representing the vertical index). At 406, the memory device sets or turns the voltage of the x wordline to 1.5V. At 408, the memory device sets or turns the voltage of the y bitline which is connected to the nFET of the cell to 3V. For example, in array 300 of FIG. 3, the bitlines connected to the nFETs are B0R, B1R, and B2R (or ByR). At 410, the memory device sets or turns the voltage of they bitline which is connected to the pFET of the cell to 0V. For example, in array 300 of FIG. 3, the bitlines connected to the pFETs are B0L, B1L, and B2L (or ByL). This creates a voltage of about 3.0V across the nFET of the cell (x,y), causing hot hole injection to the common floating gate of the cell (x,y) (such as common floating gate 314 of FIG. 3). Method 400 ends at 412.

Figure 5:
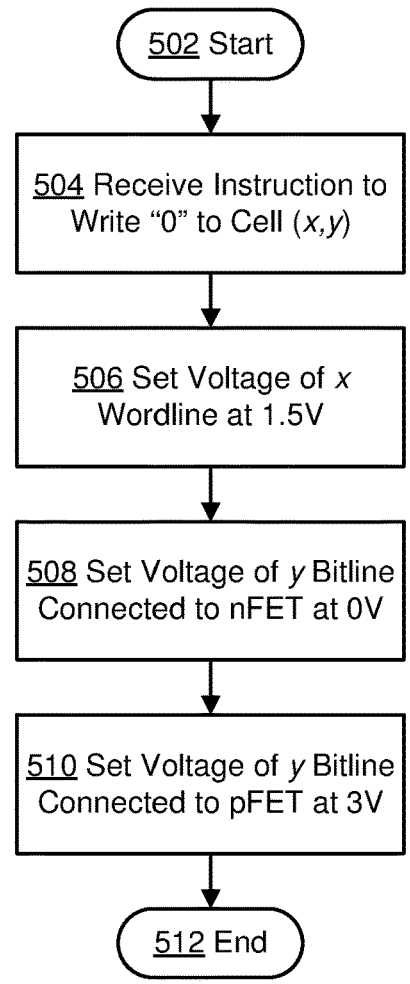
FIG. 5 depicts an example method for writing a logical "0" to an EEPROM cell, in accordance with embodiments of the present disclosure.

Referring now to FIG. 5, depicted is an example method 500 for writing a logical "0" to an EEPROM cell, in accordance with embodiments of the present disclosure. In embodiments, the EEPROM cell described in method 400 can correspond to one of EEPROM cells 100A or 100B of FIG. 1, EEPROM cells 200A or 200B of FIG. 2, EEPROM cells 330, 332, or 334 of FIG. 3, or other EEPROM cells disclosed herein and can be located within an array such as array 300 of FIG. 3. Method 500 is described herein as performed by a memory device. In various embodiments, method 500 can alternatively or additionally be performed by a memory controller, a computer system, or another component of a computer system. Method 500 can include more or less operations than those depicted. Method 500 can include operations in different orders than those depicted.

From start 502, method 500 proceeds to 504 and the memory device receives an instruction to write a logical "0" to a cell (x,y) of an array (with x representing the horizontal index and y representing the vertical index). At 506, the memory device sets or turns the voltage of the x wordline to 1.5V. At 508, the memory device sets or turns the voltage of the y bitline which is connected to the nFET of the cell to 0V. For example, in array 300 of FIG. 3, the bitlines connected to the nFETs are B0R, B1R, and B2R (or ByR). At 510, the memory device sets or turns the voltage of they bitline which is connected to the pFET of the cell to 3V. For example, in array 300 of FIG. 3, the bitlines connected to the pFETs are B0L, B1L, and B2L (or ByL). This creates a voltage of about 3.0V across the pFET of the cell (x,y), causing hot electron injection to the common floating gate of the cell (x,y) (such as common floating gate 314 of FIG. 3). Method 500 ends at 512.

Figure 6:
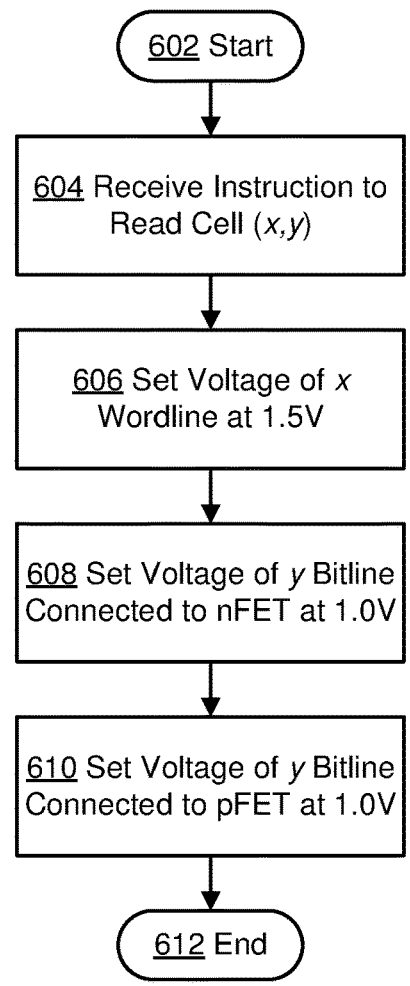
FIG. 6 depicts an example method for reading a value stored in an EEPROM cell, in accordance with embodiments of the present disclosure.

Referring now to FIG. 6, depicted is an example method 600 for reading a value stored in an EEPROM cell, in accordance with embodiments of the present disclosure. In embodiments, the EEPROM cell described in method 400 can correspond to one of EEPROM cells 100A or 100B of FIG. 1, EEPROM cells 200A or 200B of FIG. 2, EEPROM cells 330, 332, or 334 of FIG. 3, or other EEPROM cells disclosed herein and can be located within an array such as array 300 of FIG. 3. Method 600 is described herein as performed by a memory device. In various embodiments, method 600 can alternatively or additionally be performed by a memory controller, a computer system, or another component of a computer system. Method 600 can include more or less operations than those depicted. Method 600 can include operations in different orders than those depicted.

From start 602, method 600 proceeds to 604 and the memory device receives an instruction to read the logical value stored in a cell (x,y) of an array (with x representing the horizontal index and y representing the vertical index). At 606, the memory device sets or turns the voltage of the x wordline to 1.5V. At 608, the memory device sets or turns the voltage of the y bitline which is connected to the nFET of the cell to 1.0V. For example, in array 300 of FIG. 3, the bitlines connected to the nFETs are B0R, B1R, and B2R (or ByR). At 610, the memory device sets or turns the voltage of the y bitline which is connected to the pFET of the cell to 1.0V. For example, in array 300 of FIG. 3, the bitlines connected to the pFETs are B0L, B1L, and B2L (or ByL). This creates a voltage of about 1.0V across the nFET of the cell (x,y) and a voltage of about 1.0V across the pFET of the cell (x,y).

Depending on the charge of the common floating gate of the cell (x,y) (such as common floating gate 314 of FIG. 3), the nFET of the cell (x,y) will be either turned on (i.e., conducting) or turned off (i.e., non-conducting). If the nFET of the cell (x,y) is conducting, a current will flow from through the nFET from the bitline connected to the nFET to the common output terminal (e.g. terminal 308 of EEPROM cell 330 in FIG. 3), and continue on through the access transistor to the low voltage terminal (e.g. terminal 310 connected to the access transistor connected to EEPROM cell 330 in FIG. 3). If the nFET of the cell (x,y) is non-conducting, there is negligible current flow through the nFET to the common output terminal (e.g. terminal 308 of EEPROM cell 330 in FIG. 3) and through the access transistor. As a result, the presence of current flow through the access transistor indicates a value of "1" and the absence of current flow through the access transistor indicates a value of "0." Method 600 ends at 612.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A semiconductor device, comprising:
   a first nanosheet transistor connected to a first terminal;
   a second nanosheet transistor physically stacked on top of the first nanosheet transistor and connected in parallel to the first nanosheet transistor and connected to a second terminal, where the first and second nanosheet transistors share a common floating gate and a common output terminal; and
   an access transistor connected in series to the common output terminal and a low voltage terminal, the access transistor configured to trigger hot-carrier injection to the common floating gate to change a voltage of the common floating gate.

2. The semiconductor device of claim 1, wherein the first nanosheet transistor is an n-type nanosheet transistor and the second nanosheet transistor is a p-type nanosheet transistor.

3. The semiconductor device of claim 2, wherein hot-carrier injection is triggered when a voltage across one of the n-type nanosheet transistor and the p-type nanosheet transistor is about 3.0 volts.

4. The semiconductor device of claim 1, wherein the first nanosheet transistor includes a first low injection-barrier material gate dielectric and the second nanosheet transistor includes a second low injection-barrier material gate dielectric.

5. The semiconductor device of claim 4, wherein the first low injection-barrier material gate dielectric and the second low injection-barrier material gate dielectric are each selected from a group consisting of silicon nitride ($Si_3N_4$), yttrium oxide ($Y_2O_3$), zirconium dioxide ($ZrO_2$), and hafnium dioxide ($HfO_2$).

6. The semiconductor device of claim 1, wherein the voltage of the common floating gate determines a logical state of the semiconductor device.

7. The semiconductor device of claim 1, wherein the first and second nanosheet transistors are separated by a spacer material, the spacer material being formed on top of at least part of the first nanosheet transistor and touching at least part of the bottom of the second nanosheet transistor.

8. A memory array, comprising:
   an N by M array of memory cells, wherein N represents the number of rows and M represents the number of columns, each memory cell comprising:
   a first nanosheet transistor connected to a first terminal;
   a second nanosheet transistor physically stacked on top of the first nanosheet transistor and connected in parallel to the first nanosheet transistor and connected to a second terminal, where the first and second nanosheet transistors share a common floating gate and a common output terminal; and
   N access transistors, with one of the N access transistors located in each row of the array, wherein each access transistor is connected in series to a low voltage terminal and the common output terminals of M memory cells in a row, and wherein the access transistors are configured to trigger hot-carrier injection to the common floating gate to change a voltage of the common floating gate.

9. The memory array of claim 8, wherein the first nanosheet transistor is an n-type nanosheet transistor and the second nanosheet transistor is a p-type nanosheet transistor.

10. The memory array of claim 9, wherein hot-carrier injection is triggered when a voltage across one of the n-type nanosheet transistor and the p-type nanosheet transistor is about 3.0 volts.

11. The memory array of claim 8, further comprising M bitline terminals connected to the first terminals of the memory cells in respective columns of memory cells.

12. The memory array of claim 11, further comprising M bitline terminals connected to the second terminals of the memory cells in respective columns of memory cells.

13. The memory array of claim 8, wherein the voltage of the common floating gate determines a logical state of the semiconductor device.

14. The memory array of claim 8, wherein the first nanosheet transistor is disposed between the second nanosheet transistor and a substrate.

15. The memory array of claim 8, further comprising N access wordline terminals connected to gates of the N access transistors.

16. A method of forming a memory cell in a memory array formed from an N by M array of memory cells, the method comprising:
connecting a first nanosheet transistor to a first terminal;
connecting a second nanosheet transistor that is physically stacked on top of the first nanosheet transistor such that the first nanosheet transistor is between the second nanosheet transistor and a substrate, the second nanosheet transistor being connected in parallel to the first nanosheet transistor and connected to a second terminal, where the first and second nanosheet transistors share a common floating gate and a common output terminal; and
connecting an access transistor in series to the common output terminal and to a low voltage terminal, wherein the access transistor is configured to trigger hot-carrier injection to the common floating gate to change a voltage of the common floating gate.

17. The method of claim 16, wherein the first nanosheet transistor is an n-type transistor and the second nanosheet transistor is a p-type transistor.

18. The method of claim 17, wherein the access transistor is configured to trigger hot carrier injection upon application of a voltage across the n-type nanosheet transistor of about 3.0 volts to change a charge on the common floating gate and to write a logical "1" to the memory cell.

19. The method of claim 17, wherein the access transistor is configured to trigger hot carrier injection upon application of a voltage across the p-type nanosheet transistor of about 3.0 volts to change a charge on the common floating gate and to write a logical "0" to the memory cell.

20. The method of claim 16, wherein the first nanosheet transistor includes a first low injection-barrier material gate dielectric and the second transistor includes a second low injection-barrier material gate dielectric; and wherein the first low injection-barrier material gate dielectric and the second low injection-barrier material gate dielectric are each selected from a group consisting of silicon nitride ($Si_3N_4$), yttrium oxide ($Y_2O_3$), zirconium dioxide ($ZrO_2$), and hafnium dioxide ($HfO_2$).

* * * * *